(12) United States Patent
Kamizono et al.

(10) Patent No.: US 8,475,690 B2
(45) Date of Patent: Jul. 2, 2013

(54) DIFFUSING AGENT COMPOSITION, METHOD OF FORMING IMPURITY DIFFUSION LAYER, AND SOLAR BATTERY

(75) Inventors: Takashi Kamizono, Kawasaki (JP); Toshiro Morita, Kawasaki (JP); Atsushi Murota, Kawasaki (JP); Motoki Takahashi, Kawasaki (JP); Katsuya Tanitsu, Kawasaki (JP); Takaaki Hirai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 325 days.

(21) Appl. No.: 12/897,349

(22) Filed: Oct. 4, 2010

(65) Prior Publication Data

US 2011/0079262 A1    Apr. 7, 2011

(30) Foreign Application Priority Data

Oct. 5, 2009   (JP) .................... 2009-231337

(51) Int. Cl.
*H01B 1/00*   (2006.01)
*H01L 21/22*   (2006.01)

(52) U.S. Cl.
USPC .................. 252/520.22; 252/500; 252/520.2; 252/506; 252/507; 136/243; 106/287.12; 438/542; 257/E21.135

(58) Field of Classification Search
USPC .. 252/500, 506, 507, 520.2, 520.22; 136/243; 106/287.12; 438/542; 257/E21.135
See application file for complete search history.

(56) References Cited

U.S. PATENT DOCUMENTS 4,753,827 A * 6/1988 Yoldas et al. ................. 427/387
2008/0145625 A1* 6/2008 Schumacher et al. ..... 428/195.1

FOREIGN PATENT DOCUMENTS

| JP | 2003-168810 | 6/2003 |
| JP | 2003-332606 | 11/2003 |
| JP | 2006-156646 | 6/2006 |

* cited by examiner

*Primary Examiner* — Harold Pyon
*Assistant Examiner* — Katie L Hammer
(74) *Attorney, Agent, or Firm* — Knobbe Martens Olson & Bear LLP

(57) ABSTRACT

An embodiment of the present invention relates to a diffusing agent composition used in printing an impurity-diffusing component onto a semiconductor substrate, wherein the diffusing agent composition contains: a hydrolysis product of alkoxysilane (A); a component (B) containing at least one selected from the group consisting of a hydrolysis product of alkoxy titanium, a hydrolysis product of alkoxy zirconium, titania fine particle, and zirconia fine particle; an impurity-diffusing component (C); and an organic solvent (D).

8 Claims, 1 Drawing Sheet

DIFFUSING AGENT COMPOSITION, METHOD OF FORMING IMPURITY DIFFUSION LAYER, AND SOLAR BATTERY

CROSS-REFERENCE TO RELATED APPLICATIONS

This application is based upon and claims the benefit of priority from the prior Japanese Patent Application No. 2009-231337, filed on Oct. 5, 2009, the entire contents of which are incorporated herein by reference.

BACKGROUND OF THE INVENTION

1. Field of the Invention

The present invention relates to a diffusing agent composition, a method of forming an impurity diffusion layer, and a solar battery.

2. Description of the Related Art

Conventionally, in the case of, for example, forming an N-type or P-type impurity diffusion layer in a semiconductor substrate in manufacturing a solar battery, the N-type or P-type impurity diffusion layer is formed by patterning a diffusing agent containing an N-type or P-type impurity-diffusing component on the surface of the semiconductor substrate followed by diffusing the N-type or P-type impurity-diffusing component from the patterned diffusing agent. Specifically, a thermally-oxidized film is first formed on the surface of the semiconductor substrate, and a resist having a predetermined pattern is then laminated on the thermally-oxidized film by a photolithography method. Using the resist as a mask, the thermally-oxidized film that is not masked by the resist is etched with acid or alkali, and the resist is then peeled off so as to form a mask of the thermally-oxidized film. A diffusion film is then formed in a mask opening area by applying a diffusing agent containing the N-type or P-type impurity-diffusing component. An N-type or P-type impurity diffusion layer is then formed by diffusing the diffusion film by heating to high temperature.

As stated above, many processes have been conventionally required for forming an impurity diffusion layer in a semiconductor substrate. Contrary to this, for example, Japanese patent Application Publication Nos. 2003-168810, 2003-332606, and 2006-156646 disclose a method of patterning a diffusing agent on the surface of a semiconductor substrate by using an ink-jet method. An ink-jet method does not require complicated processes compared to a conventional photolithography method, etc., because patterning is performed by selectively discharging a diffusing agent onto the forming region of an impurity diffusion layer from an ink-jet nozzle without using a mask, thus allowing for a pattern to be easily formed while reducing an amount of a liquid to be used.

SUMMARY OF THE INVENTION

In a diffusing agent used in the patterning method employing the aforementioned ink-jet method, there are demands for: (1) improvement in diffusion performance for the purpose of improving electrical property; and (2) improvement of acid resistance in the process involving an acid treatment. Of the two, it is known that the challenge regarding (2) can be solved by a curing treatment at high temperature. However, there is the possibility that a device may be adversely affected by a curing treatment at high temperature (900° C. or higher), and hence a solution is required in which a curing treatment is performed at lower temperature.

The present invention has been made in view of these situations, and a purpose of the invention is to provide: a diffusing agent composition in which diffusion performance, and accordingly electrical property and acid resistance can be improved; a method of forming an impurity diffusion layer using the diffusing agent composition; and a solar battery.

A first embodiment of the present invention relates to a diffusing agent composition used in printing an impurity-diffusing component onto a semiconductor substrate, wherein the diffusing agent composition contains: a hydrolysis product of alkoxysilane (A); a component (B) containing at least one selected from the group consisting of a hydrolysis product of alkoxy titanium, a hydrolysis product of alkoxy zirconium, titania fine particle, and zirconia fine particle; an impurity-diffusing component (C); and an organic solvent (D).

According to the diffusing agent composition of this embodiment, impurity diffusion performance, and eventually electrical property and acid resistance can be improved when an impurity diffusion layer is formed in a semiconductor substrate.

A second embodiment of the present invention relates to a method of forming an impurity diffusion layer. The method of forming an impurity diffusion layer comprises: forming a pattern by printing the diffusing agent composition according to the aforementioned embodiment onto a semiconductor substrate; and diffusing the impurity-diffusing component (C) in the diffusing agent composition into the semiconductor substrate.

According to this embodiment, an impurity diffusion layer can be formed in which the impurity diffusion performance, accordingly the electrical property, and furthermore the acid resistance are improved.

A third embodiment of the present invention relates to a solar battery. The solar battery comprises a semiconductor substrate in which an impurity diffusion layer is formed by the method of forming an impurity diffusion layer according to the aforementioned embodiment.

According to this embodiment, a solar battery with higher reliability can be obtained.

BRIEF DESCRIPTION OF THE DRAWINGS

Embodiments will now be described, by way of example only, with reference to the accompanying drawings, which are meant to be exemplary, not limiting, and wherein like elements are numbered alike in several figures, in which.

DETAILED DESCRIPTION OF THE INVENTION

Figure 1A:
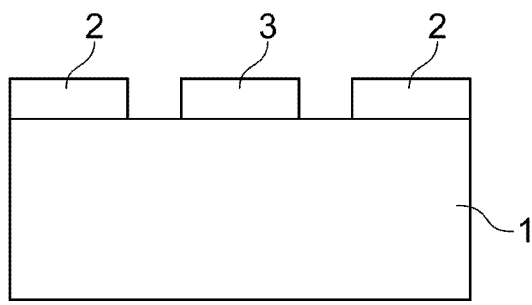
FIGS. 1A to 1E are process sectional views illustrating a method of manufacturing a solar battery comprising the method of forming an impurity diffusion layer according to the embodiment.

The invention will now be described by reference to the preferred embodiments. This does not intend to limit the scope of the present invention, but to exemplify the invention.

The diffusing agent composition according to the embodiment is used in printing an impurity-diffusing component onto a semiconductor substrate. The semiconductor substrate can be used as a substrate for a solar battery. The diffusing agent composition contains a hydrolysis product of alkoxysilane (A), a metal-containing component (B), an impurity-diffusing component (C), and an organic solvent (D). Hereinafter, each component of the diffusing agent composition according to the present embodiment will be described in detail.

(A) Hydrolysis Product of Alkoxysilane

Alkoxysilane, a starting material for the hydrolysis product, is an Si-containing compound represented by the following formula (1):

[Formula 1]

$$R^1_l Si(OR^2)_{4-l} \quad (1)$$

wherein $R^1$ represents a hydrogen atom, alkyl group, or phenyl group, $R^2$ an alkyl group or phenyl group, and l is 0, 1, or 2.

When $R^1$ is an alkyl group, a linear or branched alkyl group having 1 to 20 carbon atoms is preferred, and a linear or branched alkyl group having 1 to 4 carbon atoms is more preferred. At least one of $R^1$ is an alkyl group or phenyl group.

When $R^2$ is an alkyl group, a linear or branched alkyl group having 1 to 5 carbon atoms is preferred, and an alkyl group having 1, or 2 carbon atoms is more preferred in terms of hydrolysis rate. It is preferable that l is 0.

When multiple $R^1$ are bonded to Si, the multiple $R^1$ may or may not be the same as each other. In addition, the multiple $(OR^2)$ groups, bonded to Si, may or may not be the same as each other.

The silane compound (i), occurring when l is 0 in the above general formula (1), is represented by the following general formula (II):

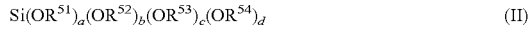

$$Si(OR^{51})_a(OR^{52})_b(OR^{53})_c(OR^{54})_d \quad (II)$$

wherein $R^{51}$, $R^{52}$, $R^{53}$, and $R^{54}$ each and independently represent the same alkyl group or phenyl group as the above $R^2$. a, b, c, and d are integers satisfying $0 \leq a \leq 4$, $0 \leq b \leq 4$, $0 \leq c \leq 4$, and $0 \leq d \leq 4$, and $a+b+c+d=4$.

The silane compound (ii), occurring when l is 1 in the general formula (1), is represented by the following general formula (III):

$$R^{65}Si(OR^{66})_e(OR^{67})_f(OR^{68})_g \quad (III)$$

wherein $R^{65}$ represents the same hydrogen atom, alkyl group, or phenyl as the above $R^1$. $R^{66}$, $R^{67}$, and $R^{68}$ each and independently represent the same alkyl group or phenyl group as the above $R^2$. e, f, and g are integers satisfying $0 \leq e \leq 3$, $0 \leq f \leq 3$, and $0 \leq g \leq 3$, and $e+f+g=3$.

The silane compound (iii), occurring when l is 2 in the general formula (1), is represented by the following general formula (IV):

$$R^{70}R^{71}Si(OR^{72})_h(OR^{73})_i \quad (IV).$$

wherein $R^{70}$ and $R^{71}$ represent the same hydrogen atom, alkyl group, or phenyl group as the above $R^1$. However, at least one of $R^{70}$ and $R^{71}$ represents the alkyl group or phenyl group. $R^{72}$ and $R^{73}$ each and independently represent the same alkyl group or phenyl group as the above $R^2$. h and i are integers satisfying $0 \leq h \leq 2$ and $0 \leq i \leq 2$ and $h+I=2$.

Specific examples of the silane compound (i) include tetraalkoxysilanes such as tetramethoxysilane, tetraethoxysilane, tetrapropoxysilane, tetrabutoxysilane, tetrapentyloxysilane, tetraphenyloxysilane, trimethoxymonoethoxysilane, dimethoxydiethoxysilane, triethoxymonomethoxysilane, trimethoxymonopropoxysilane, monomethoxytributoxysilane, monomethoxytripentyloxysilane, monomethoxytriphenyloxysilane, dimethoxydipropoxysilane, tripropoxymonomethoxysilane, trimethoxymonobutoxysilane, dimethoxydibutoxysilane, triethoxymonopropoxysilane, diethoxydipropoxysilane, tributoxymonopropoxysilane, dimethoxymonoethoxymonobutoxysilane, diethoxymonomethoxymonobutoxysilane, diethoxymonopropoxymonobutoxysilane, dipropoxymonomethoxymonoethoxysilane, dipropoxymonomethoxymonobutoxysilane, dipropoxymonoethoxymonobutoxysilane, dibutoxymonomethoxymonoethoxysilane, dibutoxymonoethoxymonopropoxysilane, and monomethoxymonoethoxymonopropoxymonobutoxysilane, etc. Among them, tetramethoxysilane and tetraethoxysilane are preferred.

Specific examples of the silane compound (ii) include methyltrimethoxysilane, methyltriethoxysilane, methyltripropoxysilane, methyltripentyloxysilane, ethyltrimethoxysilane, ethyltripropoxysilane, ethyltripentyloxysilane, ethyltriphenyloxysilane, propyltrimethoxysilane, propyltriethoxysilane, propyltripentyloxysilane, propyltriphenyloxysilane, butyltrimethoxysilane, butyltriethoxysilane, butyltripropoxysilane, butyltripentyloxysilane, butyltriphenyloxysilane, methylmonomethoxydiethoxysilane, ethylmonomethoxydiethoxysilane, propylmonomethoxydiethoxysilane, butylmonomethoxydiethoxysilane, methylmonomethoxydipropoxysilane, methylmonomethoxydipentyloxysilane, methylmonomethoxydiphenyloxysilane, ethylmonomethoxydipropoxysilane, ethylmonomethoxydipentyloxysilane, ethylmonomethoxydiphenyloxysilane, propylmonomethoxydipropoxysilane, propylmonomethoxydipentyloxysilane, propylmonomethoxydiphenyloxysilane, butylmonomethoxydipropoxysilane, butylmonomethoxydipentyloxysilane, butylmonomethoxydiphenyloxysilane, methylmethoxyethoxypropoxysilane, propylmethoxyethoxypropoxysilane, butylmethoxyethoxypropoxysilane, methylmonomethoxymonoethoxymonobutoxysilane, ethylmonomethoxymonoethoxymonobutoxysilane, propylmonomethoxymonoethoxymonobutoxysilane, butylmonomethoxymonoethoxymonobutoxysilane, etc. Among them, methyltrialkoxysilane (in particular, methyltrimetoxysilane, methyltriethoxysilane) is preferred.

Specific examples of the silane compound (iii) include methyldimethoxysilane, methylmethoxyethoxysilane, methyldiethoxysilane, methylmethoxypropoxysilane, methylmethoxypentyloxysilane, methylmethoxyphenyloxysilane, ethyldipropoxysilane, ethylmethoxypropoxysilane, ethyldipentyloxysilane, ethyldiphenyloxysilane, propyldimethoxysilane, propylmethoxyethoxysilane, propylethoxypropoxysilane, propyldiethoxysilane, propyldipentyloxysilane, propyldiphenyloxysilane, butyldimethoxysilane, butylmethoxyethoxysilane, butyldiethoxysilane, butylethoxypropoxysilane, butyldipropoxysilane, butylmethyldipentyloxysilane, butylmethyldiphenyloxysilane, dimethyldimethoxysilane, dimethylmethoxyethoxysilane, dimethyldiethoxysilane, dimethyldipentyloxysilane, dimethyldiphenyloxysilane, dimethylethoxypropoxysilane, dimethyldipropoxysilane, diethyldimethoxysilane, diethylmethoxypropoxysilane, diethyldiethoxysilane, diethylethoxypropoxysilane, dipropyldimethoxysilane, dipropyldiethoxysilane, dipropyldipentyloxysilane, dipropyldiphenyloxysilane, dibutyldimethoxysilane, dibutyldiethoxysilane, dibutyldipropoxysilane, dibutylmethoxypentyloxysilane, dibutylmethoxyphenyloxysilane, methylethyldimethoxysilane, methylethyldiethoxysilane, methylethyldipropoxysilane, methylethyldipentyloxysilane, methylethyldiphenyloxysilane, methylpropyldimethoxysilane, methylpropyldiethoxysilane, methylbutyldimethoxysilane, methylbutyldiethoxysilane, methylbutyldipropoxysilane, methylethylethoxypropoxysilane, ethylpropyldimethoxysilane, ethylpropylmethoxyethoxysilane, dipropyldimethoxysilane, dipropylmethoxyethoxysilane, propylbutyldimethoxysilane, propylbutyldiethoxysilane, dibutylmethoxyethoxysilane, dibutylmethoxypropoxysilane, dibutylethoxypropoxysilane, etc. Among them, methyldimethoxysilane and methyldiethoxysilane are preferred.

(B) Metal-Containing Component

The metal-containing component (B) contains at least one selected from the group consisting of a hydrolysis product of alkoxy titanium (B-1), a hydrolysis product of alkoxy zirconium (B-2), titania fine particle, and zirconia fine particle.

Alkoxy titanium, a starting raw material for the hydrolysis product (B-1), is a metal alkoxide represented by the following formula (2):

[Formula 2]

$$R^3_m Ti(OR^4)_{4-m} \quad (2)$$

wherein $R^3$ and $R^4$ are alkyl groups and m is 0, 1, or 2.

Examples of the alkoxy titanium include tetra-n-propoxy titanium, tetra-n-butoxy titanium, tetrastearoxytitanium, tetraethoxytitanium, tetra(2-propoxy)titanium, tetrabutoxytitanium, tetra(sec-butoxy)titanium, tetra-i-butoxy titanium, tetra(tert-butoxy)titanium, tetra(tert-amyl)titanium, and tetrakis(1-methoxy-2-methyl-2-propoxy)titanium, etc. Tetra-i-propoxy titanium is preferred.

The alkoxy zirconium, a starting raw material for the hydrolysis product (B-2), is a metal alkoxide represented by the following formula (3):

[Formula 3]

$$R^5_n Zr(OR^6)_{4-n} \quad (3)$$

wherein $R^5$ and $R^6$ are alkyl groups and n is 0, 1, or 2.

Examples of the alkoxy zirconium include tetramethoxyzirconium, tetraethoxyzirconium, tetrapropoxyzirconium, tetra-i-propoxyzirconium, tetrabutoxyzirconium, tetra-i-butyloxyzirconium, tetra(sec-butyloxy)zirconium, tetra(tert-butyloxy)zirconium, tetra(amyloxy)zirconium, tetra(tert-amyloxy)zirconium, tetrakis[2-(2-methoxy)ethoxy]zirconium, tetrakis[2-(1-methyl-2-methoxy)propoxy]zirconium, tetrakis[2-(2-methoxy)propoxy]zirconium, tetrakis[2-(dimethylamino) ethoxy]zirconium, tetrakis[2-(2-dimethylamino-1-methyl) propoxy]zirconium, tetrakis[2-(2-dimethylamino)propoxy]zirconium, bis(2-propoxy)bis[2-(2-dimethylamino-1-methyl) propoxy]zirconium, bis(tert-butoxy)bis[2-(2-dimethylamino-1-methyl) propoxy] zirconium, bis(tert-butoxy)bis[2-(2-dimethylamino) propoxy]zirconium, (tert-butoxy)tris[2-(2-dimethylamino-1-methyl)propoxy]zirconium, tris(tert-butoxy) [2-(2-dimethylamino-1-methyl)propoxy]zirconium, etc. Tetrapropoxyzirconium is preferred.

The average particle size of the titania fine particle is preferred to be within a range of 0.1 to 100 nm, more preferred to be within a range of 1 to 50 nm, and still more preferred to be within a range of 10 to 20 nm.

The average particle size of the zirconia fine particle is preferred to be within a range of 0.1 to 100 nm, more preferred to be within a range of 1 to 50 nm, and still more preferred to be within a range of 5 to 10 nm.

The aforementioned hydrolysis product can be prepared by a method in which, for example, one compound selected from the aforementioned starting materials for the hydrolysis consisting of (A-1), (B-1), and (B-2) is hydrolyzed in the presence of an acid catalyst, water, and an organic solvent.

The aforementioned acid catalyst can be any one of organic acids and inorganic acids. Examples of the inorganic acid include sulfuric acid, phosphoric acid, nitric acid, and hydrochloric acid, etc. Among them, phosphoric acid and nitric acid are preferred. Examples of the organic acid include both carboxylic acids, such as formic acid, oxalic acid, fumaric acid, maleic acid, glacial acetic acid, acetic acid anhydride, propionic acid, and n-butyric acid, etc., and organic acids having a sulfur-containing acid residue. An example of the organic acids having a sulfur-containing acid residue includes organic sulfonic acid, and examples of the esterificated compounds thereof include organic sulfate ester and organic sulfite ester, etc. Among them, organic sulfonic acid, for example, a compound represented by the following general formula (V), is particularly preferred.

$$R^{13}—X \quad (V)$$

wherein $R^{13}$ is a hydrocarbon group that may have a substituent group, and X is a sulfonic acid group.

In the aforementioned general formula (V), it is preferable that the hydrocarbon group as $R^{13}$ has 1 to 20 carbon atoms. The hydrocarbon group may be saturated or unsaturated, or may be linear, branched, or circular. When the hydrocarbon group of $R^{13}$ is circular, aromatic hydrocarbon groups, for example, phenyl group, naphthyl group, and anthryl group are preferred. Among them, a phenyl group is particularly preferred. One or more hydrocarbon groups having 1 to 20 carbon atoms may be bonded to the aromatic ring in the aromatic hydrocarbon group as a substituent group. The hydrocarbon group as a substituent group on the aromatic ring may be saturated or unsaturated, or may be linear, branched, or circular. In addition, the hydrocarbon group as $R^{13}$ may have one or more substituent groups. Examples of the substituent group include, for example, a halogen atom such as fluorine atom, sulfonic acid group, carboxyl group, hydroxyl group, amino group, cyano group, etc. As the organic sulfonic acids represented by the above general formula (V), nonafluorobutanesulfonic acid, methanesulfonic acid, trifluoromethanesulfonic acid, dodecylbenzenesulfonic acid, or mixtures thereof are particularly preferred in terms of the effect in improving the shape under the resist pattern.

Although the aforementioned acid catalyst acts as a catalyst when the silane compound is hydrolyzed in the presence of water, it is better that a use amount of the acid catalyst is prepared such that the concentration thereof in the hydrolysis reaction system is within a range of 1 to 1,000 ppm, in particular, 5 to 800 ppm. Because the hydrolysis rate of a siloxane polymer will be changed in accordance with an addition amount of water, the amount of water is determined in accordance with the hydrolysis rate to be obtained.

Examples of the organic solvent in the hydrolysis reaction system includes, for example: monohydric alcohol, such as methanol, ethanol, propanol, isopropanol (IPA), and n-butanol; alkyl carboxylate ester, such as methyl-3-methoxypropionate and ethyl-3-ethoxypropionate; polyhydric alcohol, such as ethylene glycol, diethylene glycol, propylene glycol, glycerin, trimethylolpropane, and hexanetriol; monoethers or monoacetates of polyhydric alcohol, such as ethylene glycol monomethyl ether, ethylene glycol monoethyl ether, ethylene glycol monopropyl ether, ethylene glycol monobutyl ether, diethylene glycol monomethyl ether, diethylene glycol monoethyl ether, diethylene glycol monopropyl ether, diethylene glycol monobutyl ether, propylene glycol monomethyl ether, propylene glycol monoethyl ether, propylene glycol monopropyl ether, and propylene glycol monobutyl ether; esters, such as methyl acetate, ethyl acetate, and butyl acetate; ketones, such as acetone, methyl ethyl ketone, and methyl isoamyl ketone; and polyhydric alcohol ethers in which all hydroxyl groups in polyhydric alcohol are alkyl-etherified, such as ethylene glycol dimethyl ether, ethylene glycol diethyl ether, ethylene glycol dipropyl ether, ethylene glycol dibutyl ether, propylene glycol dimethyl ether, propylene glycol diethyl ether, diethylene glycol dimethyl ether, diethylene glycol diethyl ether, and diethylene glycol methyl ethyl ether. The aforementioned organic solvent may be used alone or in combination of two or more of them.

(C) Impurity-Diffusing Component

The impurity-diffusing component (C) is a compound generally used for manufacturing a solar battery as a dopant. The impurity-diffusing component (C) is an N-type or P-type impurity-diffusing component containing a compound of a III group (XIII group) element or V group (XV group) element. In the process of forming electrodes in a solar battery, an N-type or P-type impurity diffusion layer (impurity-diffusion region) can be formed in a semiconductor substrate by using the impurity-diffusing component. Examples of the compound of a V group element, contained in the impurity-diffusing component (C), include, for example, $P_2O_5$, $Bi_2O_3$, $Sb(OCH_2CH_3)_3$, $SbCl_3$, and $As(OC_4H_9)_3$. The concentration of the impurity-diffusing component (C) is appropriately adjusted in accordance with the layer thickness, etc., of the impurity diffusion layer formed in a semiconductor substrate. Examples of the impurity-diffusing component (C) containing a III group element include $B_2O_3$ and $Al_2O_3$, etc.

A balance between the blending amount of the hydrolysis product of alkoxysilane (A) and the metal-containing component (B), and that of the impurity-diffusing component (C) is important for exerting an effect in diffusing impurities. In the case where the total of the blending amounts of the hydrolysis product of alkoxysilane (A), the metal-containing component (B), and the impurity-diffusing component (C) is 100%, a good diffusion effect can be obtained when the total ratio of the blending amounts of the hydrolysis product of alkoxysilane (A) and the metal-containing component (B) is 50 to 90% and the blending ratio of the impurity-diffusing component (C) is 10 to 50%.

(D) Organic Solvent

Examples of the organic solvent (D) include, for example: alcohols, such as methanol, ethanol, isopropanol, and butanol; ketones, such as acetone, diethyl ketone, and methyl ethyl ketone; esters, such as methyl acetate, ethyl acetate, and butyl acetate; ethers, such as ethylene glycol dimethyl ether, ethylene glycol diethyl ether, propylene glycol dimethyl ether, and propylene glycol diethyl ether; monoether glycols, such as ethylene glycol monomethyl ether, ethylene glycol monoethyl ether, propylene glycol monomethyl ether, and propylene glycol monoethyl ether; circular ethers, such as tetrahydrofran and dioxane; and ether esters, such as propylene glycol monomethyl ether acetate and propylene glycol monoethyl ether acetate, etc.

(E) Other Components

The diffusing agent composition according to the embodiment of the present invention may further contain a surfactant (hereinafter, also referred to as an "(E) component"). By containing the (E) component, coating property, planarization property, and development property can be improved, thereby allowing for occurrence of uneven coating in the diffusing agent composition layer, formed after the coating, to be reduced. Although a conventionally known component can be used as such an (E) component, a silicone-based surfactant is preferred. In addition, it is preferable that the (E) component is contained in an amount within a range of 500 to 3,000 ppm by mass, particularly 600 to 2,500 ppm by mass, based on the whole diffusing agent composition. It is further preferable that the (E) component is contained in an amount of 2,000 ppm by mass or less, because the detachability of the diffusing agent composition layer after a diffusion treatment is excellent. The (E) component may be used alone or in combination.

It is preferable that the concentration of the metal impurities, contained in the diffusing agent composition according to the embodiment of the present invention (other than the metal components contained in the aforementioned components (A), (B), and (C)), is smaller than or equal to 500 ppm. Thereby, a drop in the efficiency of the photovoltaic effect, occurring when metal impurities are contained, can be suppressed.

According to the diffusing agent composition having each component described above, the impurity diffusion property can be improved when a semiconductor substrate is coated, and eventually the electrical property of the semiconductor substrate can be improved. Further, the acid resistance can be improved by a curing treatment at lower temperature.

When the metal-containing component (B) contains the hydrolysis product of alkoxy titanium (B-1) or the titania fine particle, it is preferable that the mass ratio of the mass of the solid in terms of $SiO_2$ based on the whole composition, to the mass of the solid in terms of $TiO_2$ based on the whole composition (the amount of the solid in terms of $SiO_2$:the amount of the solid in terms of $TiO_2$) is within a range of 85:15 to 98:2. It is more preferable that the ratio of the above two amounts is within a range of 95:5 to 98:2. By making the content of titanium larger than or equal to the minimum (98:2), the hydrofluoric acid resistance can be remarkably improved. By making the content thereof smaller than or equal to the maximum (85:15), the impurity-diffusing performance can be made almost the same as when neither the hydrolysis product (B-1) nor the titania fine particle is contained, or can be improved.

(Method of Forming Impurity Diffusion Layer and Method of Manufacturing Solar Battery)

Referring to FIG. 1, a method of forming an impurity diffusion layer comprising: forming a pattern by discharging the aforementioned diffusing agent composition containing the N-type impurity-diffusing component (C) onto an N-type semiconductor substrate with the use of an ink-jet method; and diffusing the impurity-diffusing component (C) in the diffusing agent component in the semiconductor substrate, and a method of manufacturing solar battery comprising a semiconductor substrate in which the impurity diffusion layer has been formed by the aforementioned method, will be described. FIGS. 1A to 1E are process sectional views illustrating a method of manufacturing a solar battery comprising the method of forming an impurity diffusion layer according to the embodiment.

As illustrated in FIG. 1A, the aforementioned diffusing agent composition 2 containing the N-type impurity-diffusing component (C), and a diffusing agent composition 3 containing a P-type impurity-diffusing component, are first selectively coated on an N-type semiconductor substrate 1, such as a silicon substrate. The diffusing agent composition 3 containing a P-type impurity diffusing component is prepared by a well-known method in which the diffusing agent composition 3 is coated on the whole surface of the semiconductor substrate 1 by a well-known method, such as, for example, spin coating, and then the coated diffusing agent composition 3 is dried by a well-known means, such as an oven. Thereafter, the diffusing agent composition 3 is patterned by a well-known photolithography method and etching method. Alternatively, a pattern may be formed by selectively coating the diffusing agent composition 3 on the surface of the semiconductor substrate 1 with the use of an ink-jet method.

The diffusing agent composition 2 is patterned by selectively being coated on the surface of the semiconductor substrate 1 with the use of an ink-jet method. That is, patterning is performed by discharging the diffusing agent composition 2 on the forming region of the N-type impurity diffusion layer of the semiconductor substrate 1 from the ink-jet nozzle of a well-known ink-jet discharge device. After the pattern has been formed, the coated diffusing agent composition 2 is hardened and dried by a well-known means, such as an oven, etc. As the ink-jet discharge device, a discharge device of a piezo method is used in which a piezo element (piezoelectric element) that is deformed when a voltage is applied is employed. Alternatively, a discharge device of a thermal method utilizing air bubbles generated by heating may be used.

Figure 1B:
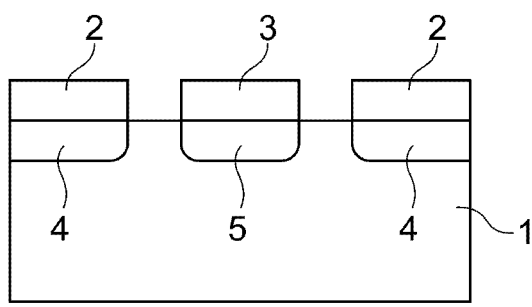

Subsequently, as illustrated in FIG. 1B, the semiconductor substrate 1 on which the diffusing agent compositions 2 and 3 are patterned is placed and calcined in a diffusion furnace, such as, for example, an electrical furnace, etc., so that both the N-type impurity-diffusing component (C) in the diffusing agent composition 2 and the P-type impurity-diffusing component in the diffusing agent composition 3 are diffused into the semiconductor substrate 1 from the surface thereof. Alternatively, the semiconductor substrate 1 may be heated by radiation of a commonly used laser instead of a diffusion furnace. Thus, the N-type impurity-diffusing component (C) is diffused into the semiconductor substrate 1 to form an N-type impurity diffusion layer 4, and the P-type impurity-diffusing component is diffused thereinto to form a P-type impurity diffusion layer 5.

Figure 1C:
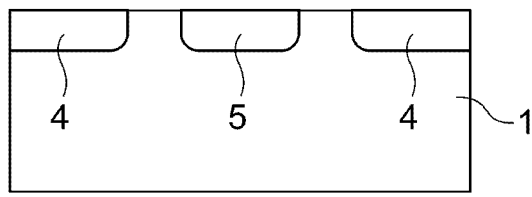

Subsequently, as illustrated in FIG. 1C, the oxide film formed on the surface of the semiconductor substrate is removed by a well-known etching method.

Figure 1D:
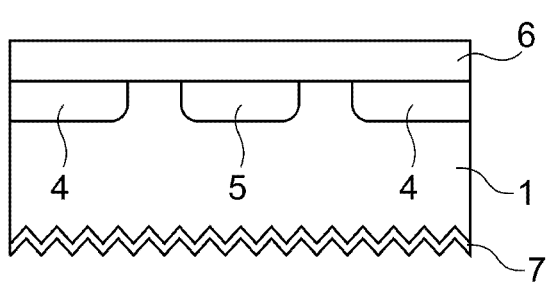

Subsequently, as illustrated in FIG. 1D, a passivation layer 6 is formed, by using thermal oxidation, etc., on the surface of the semiconductor substrate 1 on the side where the N-type impurity diffusion layer 4 and the P-type impurity diffusion layer 5 have been formed. Further, a texture structure having fine convex/concave structures is formed, by using a well-known method, on the surface of the semiconductor substrate 1, the surface being opposite to the surface of the semiconductor substrate 1 where the passivation layer 6 has been formed, so that a silicon nitride film 7 having an effect of preventing sunlight from being reflected is formed thereon.

Figure 1E:
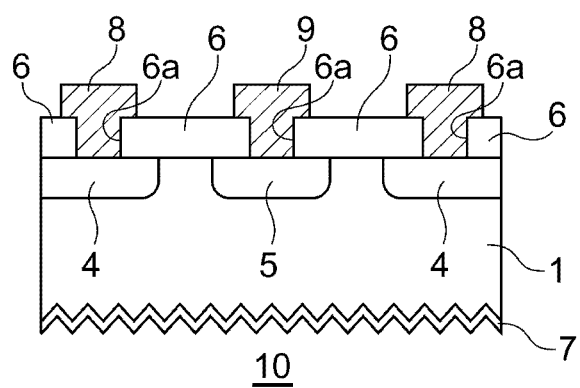

Subsequently, as illustrated in FIG. 1E, the passivation layer 6 is selectively removed by a well-known photolithography method and etching method to form contact holes 6a such that certain areas of the N-type impurity diffusion layer 4 and the P-type impurity diffusion layer 5 are exposed. Then, electrodes 8 electrically connected with the N-type impurity diffusion layer 4 are formed in the contact holes 6a, provided on the N-type impurity diffusion layer 4, by filling the contact holes 6a with a desired metal with the use of, for example, an electrolytic plating method or an electroless plating method. Similarly, electrodes 9 electrically connected with the P-type impurity diffusion layer 5 are formed in the contact holes 6a provided on the P-type impurity diffusion layer 5. A solar battery 10 according to the present embodiment can be manufactured by the aforementioned processes.

The present invention should not be limited to the aforementioned embodiments, and various modifications, such as design modifications, can be made with respect to the above embodiments based on the knowledge of those skilled in the art, and an embodiment with such a modification should fall within the scope of the present invention.

EXAMPLES

Hereinafter, examples of the present invention will be described, which do not intend to limit the scope of the invention, but are presented as preferred illustrative examples of the invention.

Diffusing Agent Composition

Examples 1 to 7

Examples 1 to 7 are diffusing agent compositions containing a hydrolysis product of alkoxy titanium as the metal-containing component (B). A method of preparing the diffusing agent compositions of Examples 1 to 7 will be described below.

(1) 1440 g of ethanol, 2565 g of tetraethoxysilane, 445 g of water, and 3.9 ml of concentrated hydrochloric acid were mixed to prepare an $SiO_2$ based coating liquid for forming coated layer (original liquid 1).

(2) 486 g of ethanol, 185 g of tetrapropoxytitanium, 67 g of acetic acid, and 131 g of acetylacetone were mixed to prepare a $TiO_2$ based coating liquid for forming coated layer (original liquid 2).

(3) Assuming that the sum of the concentration of the solid in terms of $SiO_2$ and that in terms of $TiO_2$ is 7%, the concentration of $P_2O_5$ solid is 5.4%, the concentration of dipropylene glycol is 25.0%, and ethanol is used as a solvent, each diffusing agent composition of Examples 1 to 7, illustrated in Table 1, was prepared by changing the ratio of the solid in terms of $SiO_2$ to that in terms of $TiO_2$.

Comparative Example

The diffusing agent composition of Comparative Example is composed of only the aforementioned original liquid 1. That is, the concentration of the solid in terms of $TiO_2$ is zero in the diffusing agent composition of Comparative Example, as illustrated in Table 1.

TABLE 1

|  | EXAMPLE 1 | EXAMPLE 2 | EXAMPLE 3 | EXAMPLE 4 | EXAMPLE 5 | EXAMPLE 6 | EXAMPLE 7 | COMPARATIVE EXAMPLE |
|---|---|---|---|---|---|---|---|---|
| CONCENTRATION OF $SiO_2$ SOLID | 4.90% | 5.60% | 5.95% | 6.30% | 6.65% | 6.75% | 6.86% | 7.00% |
| CONCENTRATION OF $TiO_2$ SOLID | 2.10% | 1.40% | 1.05% | 0.70% | 0.35% | 0.24% | 0.14% | 0.00% |
| CONCENTRATION OF $P_2O_5$ SOLID | 5.40% | 5.40% | 5.40% | 5.40% | 5.40% | 5.40% | 5.40% | 5.40% |
| CONCENTRATION OF DIPROPYLENE GLYCOL | 25.00% | 25.00% | 25.00% | 25.00% | 25.00% | 25.00% | 25.00% | 25.00% |

TABLE 1-continued

|  | EXAMPLE 1 | EXAMPLE 2 | EXAMPLE 3 | EXAMPLE 4 | EXAMPLE 5 | EXAMPLE 6 | EXAMPLE 7 | COMPARATIVE EXAMPLE |
|---|---|---|---|---|---|---|---|---|
| SOLVENT | EtOH | EtOH | EtOH | EtOH | EtOH | EtOH | EtOH | EtOH |
| RATIO OF SOLID IN TERMS OF $SiO_2$ TO SOLID IN TERMS OF $TiO_2$ | 70:30 | 80:20 | 85:15 | 90:10 | 95:5 | 96.6:3.4 | 98:2 | 100:0 |
| SHEET RESISTANCE VALUE (3000 ANGSTROM AFTER BAKING) | 61.7 | 28 | 23.1 | — | 17.3 | — | 19 | 22.7 |
| SHEET RESISTANCE VALUE (800 ANGSTROM AFTER BAKING) | — | — | 62.4 | 36.2 | 25.1 | 24 | 24.4 | 32.1 |
| SOLUTION RATE IN 0.1% HYDROFLUORIC ACID (Å/min.) | 15 | 18 | 20 | 2 | 2 | 2 | 42 | 72 |

Examples 8 to 12

Examples 8 to 12 are diffusing agent compositions containing titania fine particle as the metal-containing component (B). A method of preparing the diffusing agent compositions of Examples 8 to 12 will be described below.

(1) 1440 g of ethanol, 2565 g of tetraethoxysilane, 445 g of water, and 3.9 ml of concentrated hydrochloric acid were mixed to prepare an $SiO_2$ based coating liquid for forming coated layer (original liquid 1).

(2) Assuming that the sum of the concentration of the solid in terms of $SiO_2$ and that in terms of $TiO_2$ is 7%, the concentration of $P_2O_5$ solid is 5.4%, the concentration of dipropylene glycol is 25.0%, and ethanol is used as a solvent, each diffusing agent composition of Examples 8 to 12, illustrated in Table 2, was prepared by changing the ratio of the solid in terms of $SiO_2$ to that in terms of $TiO_2$.

TABLE 2

|  | EXAMPLE 8 | EXAMPLE 9 | EXAMPLE 10 | EXAMPLE 11 | EXAMPLE 12 |
|---|---|---|---|---|---|
| CONCENTRATION OF $SiO_2$ SOLID | 4.20% | 4.90% | 5.95% | 6.65% | 6.86% |
| CONCENTRATION OF $TiO_2$ SOLID | 2.80% | 2.10% | 1.05% | 0.35% | 0.14% |
| CONCENTRATION OF $P_2O_5$ SOLID | 5.40% | 5.40% | 5.40% | 5.40% | 5.40% |
| CONCENTRATION OF DIPROPYLENE GLYCOL | 25.00% | 25.00% | 25.00% | 25.00% | 25.00% |
| SOLVENT | EtOH | EtOH | EtOH | EtOH | EtOH |
| RATIO OF SOLID IN TERMS OF $SiO_2$ TO SOLID IN TERMS OF $TiO_2$ | 60:40 | 70:30 | 85:15 | 95:5 | 98:2 |
| SOLUTION RATE IN 0.1% HYDROFLUORIC ACID (Å/min.) | 14 | 18 | 43 | 57 | 60 |

(Evaluation of Diffusing Agent Compositions)
[Evaluation of Hydrofluoric Acid Resistance]

The hydrofluoric acid resistance of each of Examples and Comparative Example was evaluated. A specific method of evaluating the hydrofluoric acid resistance will be described below.

(1) Each diffusing agent composition was diluted with a thinner of ethanol/dipropylene glycol=3/1 to evaluate each diffusing agent composition on condition that the thickness of the coated film formed after lower temperature baking, performed on a hot plat at 80° C., 150° C., and 200° C. (for 1 minute at each temperature, totally for 3 minutes), was uniformly made to be approximately 3,000 Angstrom.

(2) Under the condition of the temperature of 23° C. and the humidity of 40%, each diffusing agent composition prepared in the above (1) was spin-coated on a silicon substrate, and then subjected to a low temperature baking treatment on a hot plate at 80° C., 150° C., and 200° C. (for 1 minute at each temperature, totally for 3 minutes). Spin coating was performed by appropriately changing the number of spin rotations to uniformly make each thickness after the low temperature baling to be approximately 3,000 Angstrom.

(3) The coated films formed in the above (2) were subjected to a low temperature curing treatment at 750° C. for 30 minutes.

(4) After being cooled, the coated films were immersed in 0.1% hydrofluoric acid for 0, 3, 5, and 10 minutes, and then the thickness of each coated film was measured with an ellipsometer. A solution rate (Angstrom/minute) was determined by dividing the decrease between the thickness after 0 minutes of immersion and that after 10 minutes of immersion, with 10. Obtained results are shown in the row of "0.1% Hydrofluoric acid solution rate" of Tables 1 and 2.

[Evaluation of Diffusion Performance]

The diffusion performance of each of Examples and Comparative Example was evaluated. It is noted that the diffusion performance was evaluated by measuring a sheet resistance value. It is generally supposed that, the smaller a sheet resistance value, the higher the diffusion capability. A specific method of evaluating a sheet resistance value will be described below. The diffusion performance of each of Examples 3, 5, 7 and Comparative Example was evaluated in the two cases where the thickness of the coated film was approximately 800 Angstrom and 3,000 Angstrom. That of each of Examples 4 and 6 was evaluated in the case where the thickness was approximately 800 Angstrom, whereas that of each of Examples 1 and 2 was evaluated in the case where the thickness was approximately 3,000 Angstrom.

(1) Each diffusing agent composition was diluted with a thinner of ethanol/dipropylene glycol=3/1 to evaluate each diffusion composition on condition that the thickness of the coated film formed after lower temperature baking was uniformly made to be approximately 800 Angstrom and 3,000 Angstrom.

(2) Under the condition of the temperature of 23° C. and the humidity of 40%, each diffusing agent composition prepared in the above (1) was spin-coated on a silicon substrate, and then subjected to a low temperature baking treatment on a hot plate at 80° C., 150° C., and 200° C. (for 1 minute at each temperature, totally for 3 minutes). Spin coating was performed by appropriately changing the number of spin rotations to uniformly make each thickness after the low temperature baling treatment to be approximately 800 Angstrom and 3,000 Angstrom.

(3) The coated films formed in the above (2) were subjected to a low temperature curing treatment at 750° C. for 30 minutes.

(4) After the silicon substrate has been cooled, a diffusion treatment ($N_2$, 950° C., 30 minutes) was performed.

(5) The oxide film of the silicon substrate that has been subjected to the above diffusion treatment (4) was subjected to an etching treatment of the oxide film by immersing the substrate in 5% HF aqueous solution for 10 minutes, so that a sheet resistance value was measured. Obtained results are shown in the row of "Sheet resistance value" of Table 1.

[Evaluation Results]
[Hydrofluoric Acid Resistance]

It was confirmed that, even when titanium was contained in an amount in which the mass ratio of the amount of the solid in terms of $SiO_2$ to that in terms of $TiO_2$ was approximately 98:2, as in Examples 7 and 12, the hydrofluoric acid resistance was improved compared to Comparative Example. However, in Example 12 in which titania fine particle has been added, the effect thereof was smaller than that in Example 7 in which the hydrolysis product of alkoxy titanium has been added.

[Diffusion Performance]

In the case where the thickness of the coated film after baking was 3,000 Angstrom, the sheet resistance value was almost the same or smaller than that in Comparative Example when the mass ratio of the amount of the solid in terms of $SiO_2$ to that in terms of $TiO_2$ was within a range of 85:15 to 98:2 (Examples 3, 5, 7). In the case where the thickness of the coated film after baking was 800 Angstrom, it was confirmed that the sheet resistance value was remarkably decreased compared to Comparative Example when the ratio of the amount of the solid in terms of $SiO_2$ to that in terms of $TiO_2$ was within a range of 95:5 to 98:2 (Examples 5, 6, 7). This tendency was confirmed in Examples 5 and 7 also in the case where the thickness of the coated film after baking was 3,000 Angstrom.

What is claimed is:

1. A diffusing agent composition used in printing an impurity-diffusing component onto a semiconductor substrate, the diffusing agent composition containing:
    a hydrolysis product of alkoxysilane (A);
    a component (B) containing at least one selected from the group consisting of a hydrolysis product of alkoxy titanium, a hydrolysis product of alkoxy zirconium, titania fine particle, and zirconia fine particle;
    an impurity-diffusing component (C); and
    an organic solvent (D).

2. The diffusing agent composition according to claim 1, wherein the alkoxysilane is represented by the following formula (1):

[Formula 1]

$$R^1{}_l Si(OR^2)_{4-l} \tag{1}$$

wherein $R^1$ represents a hydrogen atom, alkyl group, or phenyl group, $R^2$ an alkyl group or phenyl group, and l is 0, 1, or 2.

3. The diffusing agent composition according to claim 1, wherein the alkoxy titanium is represented by the following formula (2):

[Formula 2]

$$R^3{}_m Ti(OR^4)_{4-m} \tag{2}$$

wherein $R^3$ and $R^4$ are alkyl groups and m is 0, 1, or 2.

4. The diffusing agent composition according to claim 1, wherein the alkoxy zirconium is represented by the following formula (3):

[Formula 3]

$$R^5{}_n Zr(OR^6)_{4-n} \tag{3}$$

wherein $R^5$ and $R^6$ are alkyl groups and n is 0, 1, or 2.

5. The diffusing agent composition according to claim 1, wherein the mass ratio of the mass of the solid in terms of $SiO_2$ based on the whole composition, to the mass of the solid in terms of $TiO_2$ based on the whole composition (the mount of the solid in terms of $SiO_2$:the amount of the solid in terms of $TiO_2$) is within a range of 85:15 to 98:2.

6. The diffusing agent composition according to claim 1, wherein the impurity-diffusing component (c) contains a compound of a V group element.

7. A method of forming an impurity diffusion layer comprising:
    forming a pattern by printing the diffusing agent composition of claim 1 onto a semiconductor substrate; and
    diffusing the impurity-diffusing component (C) in the diffusing agent composition into the semiconductor substrate.

8. A solar battery comprising a semiconductor substrate and impurity diffusion layer formed by the method in claim 7.

* * * * *